(12) United States Patent
Miranda (10) Patent No.: US 7,913,150 B2
(45) Date of Patent: Mar. 22, 2011

(54) ERROR DETECTION IN A COMMUNICATIONS LINK

(75) Inventor: Paul C. Miranda, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1007 days.

(21) Appl. No.: 11/685,263

(22) Filed: Mar. 13, 2007

(65) Prior Publication Data

US 2008/0229174 A1 Sep. 18, 2008

(51) Int. Cl.
*H03M 13/00* (2006.01)

(52) U.S. Cl. .................. 714/781; 714/718; 714/807

(58) Field of Classification Search .................. 714/781, 714/718, 807, 799, 819, 22
See application file for complete search history.

(56) References Cited

U.S. PATENT DOCUMENTS

| 7,031,344 B2* | 4/2006 | Rakib et al. | 370/479 |
| 7,499,500 B2* | 3/2009 | Page | 375/295 |
| 7,555,016 B2* | 6/2009 | Page | 370/509 |

OTHER PUBLICATIONS

HyperTransport™ I/O Link Specification Revision 3.00, HyperTransport Technology Consortium, 428 pages, Apr. 21, 2006.
Wikipedia, "Error detection and correction," 8 pp., retrieved Feb. 21, 2007 from URL:http://en.wikipedia.org/w/index.pho?title=Error_detection_and_correction&printable=yes.
Wikipedia, "Cyclic redundancy check," 15 pp., retrieved Feb. 20, 2007 from URL://en.wikipedia.org/w/index.pho?title=Cyclic_redundancy_check&printable=yes.

* cited by examiner

*Primary Examiner* — Fritz Alphonse
(74) *Attorney, Agent, or Firm* — Zagorin O'Brien Graham LLP (57) ABSTRACT

An integrated circuit communications interface operable consistent with multiple data transmission protocols includes error detection circuitry that implements a cyclic redundancy check (i.e., CRC) function. The error detection circuitry generates a checksum based, at least in part, on a selected one of the multiple data transmission protocols. The error detection circuitry includes at least one circuit that generates a digital code according to an operation including terms common to the multiple data transmission protocols. That digital code is combined with a selected digital code to generate the CRC. The selected digital code is generated by an individual circuit corresponding to a respective one of the multiple data transmission protocols. The individual circuit generates the selected digital code according to an operation including at least terms exclusive to the respective one of the multiple data transmission protocols.

26 Claims, 6 Drawing Sheets

| | |
|---|---|
| Tree1[0] = D[1]^D[4]^D[5]^D[6]^D[7]^D[9]^D[10]^D[19]^D[23]^D[25]^D[26]^D[29] | // 13 terms |
| Tree1[1] = D[0]^D[1]^D[7]^D[8]^D[9]^D[11]^D[17]^D[18]^D[19]^D[22]^D[23]^D[24]^D[28]^D[29] | // 14 terms |
| Tree1[2] = D[0]^D[4]^D[5]^D[9]^D[11]^D[16]^D[17]^D[18]^D[19]^D[21]^D[22]^D[26]^D[27]^D[28]^D[29]^D[34]^D[35] | // 16 terms |
| Tree1[3] = D[3]^D[4]^D[8]^D[10]^D[16]^D[17]^D[18]^D[20]^D[21]^D[25]^D[26]^D[27]^D[28]^D[33]^D[34] | // 15 terms |
| Tree1[4] = D[2]^D[4]^D[5]^D[6]^D[10]^D[11]^D[15]^D[16]^D[17]^D[20]^D[21]^D[23]^D[24]^D[27]^D[29]^D[32]^D[33]^D[35] | // 17 terms |
| Tree1[5] = D[6]^D[7]^D[11]^D[14]^D[15]^D[16]^D[22]^D[25]^D[28]^D[29]^D[31]^D[32]^D[34]^D[35] | // 14 terms |
| Tree1[6] = D[5]^D[6]^D[10]^D[13]^D[14]^D[15]^D[21]^D[24]^D[27]^D[28]^D[30]^D[31]^D[33]^D[34] | // 14 terms |
| Tree1[7] = D[6]^D[7]^D[10]^D[11]^D[12]^D[13]^D[14]^D[19]^D[20]^D[25]^D[27]^D[30]^D[32]^D[33]^D[35] | // 15 terms |
| Tree1[8] = D[1]^D[4]^D[7]^D[12]^D[13]^D[18]^D[23]^D[24]^D[25]^D[31]^D[32]^D[34]^D[35] | // 13 terms |
| Tree1[9] = D[0]^D[3]^D[6]^D[11]^D[12]^D[17]^D[22]^D[23]^D[24]^D[30]^D[31]^D[33]^D[34] | // 13 terms |
| Tree1[10] = D[2]^D[4]^D[6]^D[7]^D[9]^D[12]^D[16]^D[19]^D[22]^D[26]^D[30]^D[31]^D[33]^D[35] | // 14 terms |
| Tree1[11] = D[4]^D[5]^D[7]^D[8]^D[9]^D[10]^D[14]^D[17]^D[18]^D[20]^D[22]^D[23]^D[26]^D[31]^D[32]^D[34]^D[35] | // 17 terms |
| Tree1[12] = D[4]^D[5]^D[8]^D[11]^D[14]^D[17]^D[18]^D[20]^D[22]^D[26]^D[29]^D[30]^D[31]^D[33]^D[34] | // 16 terms |
| Tree1[13] = D[3]^D[4]^D[7]^D[10]^D[13]^D[16]^D[17]^D[19]^D[21]^D[25]^D[28]^D[29]^D[30]^D[32]^D[33]^D[34] | // 16 terms |
| Tree1[14] = D[2]^D[3]^D[6]^D[9]^D[12]^D[15]^D[16]^D[18]^D[20]^D[24]^D[27]^D[28]^D[29]^D[31]^D[32]^D[33] | // 16 terms |
| Tree1[15] = D[1]^D[2]^D[5]^D[8]^D[11]^D[14]^D[15]^D[17]^D[19]^D[23]^D[26]^D[27]^D[28]^D[30]^D[31]^D[32] | // 16 terms |
| Tree1[16] = D[0]^D[5]^D[6]^D[9]^D[11]^D[14]^D[16]^D[18]^D[22]^D[23]^D[26]^D[27]^D[30]^D[31]^D[35] | // 15 terms |
| Tree1[17] = D[4]^D[5]^D[8]^D[10]^D[13]^D[15]^D[17]^D[20]^D[21]^D[25]^D[26]^D[29]^D[30]^D[34] | // 14 terms |
| Tree1[18] = D[3]^D[4]^D[7]^D[9]^D[12]^D[14]^D[16]^D[19]^D[20]^D[24]^D[25]^D[28]^D[29]^D[33] | // 14 terms |
| Tree1[19] = D[2]^D[3]^D[5]^D[7]^D[8]^D[11]^D[13]^D[15]^D[18]^D[19]^D[23]^D[24]^D[27]^D[28]^D[29]^D[32] | // 14 terms |
| Tree1[20] = D[1]^D[2]^D[4]^D[6]^D[7]^D[10]^D[12]^D[14]^D[17]^D[18]^D[22]^D[23]^D[26]^D[27]^D[31] | // 14 terms |
| Tree1[21] = D[0]^D[1]^D[4]^D[6]^D[8]^D[9]^D[12]^D[16]^D[17]^D[19]^D[21]^D[23]^D[24]^D[26]^D[35] | // 14 terms |
| Tree1[22] = D[0]^D[1]^D[4]^D[5]^D[9]^D[15]^D[16]^D[18]^D[20]^D[21]^D[23]^D[26]^D[28]^D[29]^D[34]^D[35] | // 16 terms |
| Tree1[23] = D[0]^D[3]^D[4]^D[8]^D[14]^D[15]^D[17]^D[19]^D[20]^D[22]^D[25]^D[27]^D[28]^D[29]^D[33]^D[34] | // 16 terms |
| Tree1[24] = D[0]^D[3]^D[7]^D[13]^D[14]^D[16]^D[18]^D[19]^D[21]^D[24]^D[26]^D[27]^D[28]^D[32]^D[33] | // 15 terms |
| Tree1[25] = D[2]^D[4]^D[6]^D[7]^D[13]^D[16]^D[17]^D[18]^D[20]^D[24]^D[26]^D[27]^D[32]^D[33] | // 14 terms |
| Tree1[26] = D[4]^D[7]^D[10]^D[12]^D[15]^D[16]^D[19]^D[25]^D[29]^D[30]^D[31]^D[32]^D[35] | // 14 terms |
| Tree1[27] = D[3]^D[6]^D[9]^D[11]^D[14]^D[15]^D[18]^D[24]^D[28]^D[29]^D[30]^D[31]^D[34] | // 14 terms |
| Tree1[28] = D[2]^D[5]^D[8]^D[10]^D[13]^D[14]^D[17]^D[23]^D[27]^D[28]^D[29]^D[30]^D[33] | // 14 terms |
| Tree1[29] = D[1]^D[4]^D[7]^D[9]^D[12]^D[13]^D[16]^D[22]^D[26]^D[27]^D[28]^D[29]^D[32] | // 14 terms |
| Tree1[30] = D[0]^D[3]^D[6]^D[8]^D[11]^D[12]^D[15]^D[21]^D[25]^D[26]^D[27]^D[28]^D[31] | // 14 terms |
| Tree1[31] = D[2]^D[5]^D[6]^D[7]^D[8]^D[10]^D[11]^D[12]^D[20]^D[24]^D[26]^D[27]^D[30] | // 13 terms |
| | // 468 total |

FIG. 4

| | | |
|---|---|---|
| Tree2[ 0] = | 1'b0 | |
| Tree2[ 1] = | D[3] | // 1 term |
| Tree2[ 2] = | D[1]^D[2] | // 2 terms |
| Tree2[ 3] = | D[0]^D[1] | // 2 terms |
| Tree2[ 4] = | D[0]^D[1]^D[3] | // 3 terms |
| Tree2[ 5] = | D[0]^D[2]^D[3] | // 3 terms |
| Tree2[ 6] = | D[1]^D[2] | // 2 terms |
| Tree2[ 7] = | D[0] | // 1 term |
| Tree2[ 8] = | 1'b0 | |
| Tree2[ 9] = | 1'b0 | |
| Tree2[10] = | D[1]^D[25] | // 2 terms |
| Tree2[11] = | D[0]^D[3]^D[24] | // 3 terms |
| Tree2[12] = | D[1]^D[2]^D[3] | // 3 terms |
| Tree2[13] = | D[0]^D[1]^D[2] | // 3 terms |
| Tree2[14] = | D[0]^D[1] | // 2 terms |
| Tree2[15] = | D[0] | // 1 term |
| Tree2[16] = | D[19] | // 1 term |
| Tree2[17] = | D[18] | // 1 term |
| Tree2[18] = | D[17] | // 1 term |
| Tree2[19] = | D[16] | // 1 term |
| Tree2[20] = | D[15] | // 1 term |
| Tree2[21] = | D[14] | // 1 term |
| Tree2[22] = | D[3]^D[13] | // 2 terms |
| Tree2[23] = | D[2]^D[3]^D[12] | // 3 terms |
| Tree2[24] = | D[1]^D[2]^D[11] | // 3 terms |
| Tree2[25] = | D[0]^D[1]^D[10] | // 3 terms |
| Tree2[26] = | D[0]^D[3] | // 2 terms |
| Tree2[27] = | D[2] | // 1 term |
| Tree2[28] = | D[1] | // 1 term |
| Tree2[29] = | D[0] | // 1 term |
| Tree2[30] = | 1'b0 | |
| Tree2[31] = | 1'b0 | |
| | | // 50 total |

FIG. 5

| | | |
|---|---|---|
| CTree[0] = | D[3]^D[35]^C[2]^C[5]^C[6]^C[8]^C[12]^C[20]^C[21]^C[22]^C[24]^C[25]^C[26]^C[27]^C[28]^C[30] | // 16 terms |
| CTree[1] = | D[2]^D[34]^C[2]^C[3]^C[5]^C[7]^C[8]^C[9]^C[12]^C[13]^C[20]^C[23]^C[24]^C[29]^C[30]^C[31] | // 16 terms |
| CTree[2] = | D[3]^D[33]^C[2]^C[3]^C[4]^C[5]^C[9]^C[10]^C[12]^C[13]^C[14]^C[20]^C[22]^C[23]^C[26]^C[27]^C[28] | // 17 terms |
| CTree[3] = | D[2]^D[32]^C[3]^C[4]^C[5]^C[6]^C[10]^C[11]^C[13]^C[14]^C[15]^C[21]^C[23]^C[27]^C[28]^C[29] | // 16 terms |
| CTree[4] = | D[31]^C[0]^C[2]^C[4]^C[7]^C[8]^C[11]^C[12]^C[14]^C[15]^C[16]^C[20]^C[21]^C[25]^C[26]^C[28]^C[29] | // 16 terms |
| CTree[5] = | D[30]^C[0]^C[1]^C[2]^C[3]^C[6]^C[9]^C[12]^C[15]^C[16]^C[17]^C[20]^C[24]^C[27]^C[29] | // 13 terms |
| CTree[6] = | D[29]^C[0]^C[1]^C[2]^C[3]^C[4]^C[7]^C[10]^C[16]^C[17]^C[18]^C[21]^C[25]^C[26] | // 14 terms |
| CTree[7] = | D[11]^D[3]^D[28]^C[11]^C[3]^C[4]^C[6]^C[11]^C[12]^C[17]^C[18]^C[19]^C[20]^C[21]^C[24]^C[25]^C[28]^C[30] | // 18 terms |
| CTree[8] = | D[0]^D[2]^D[31]^D[27]^C[0]^C[4]^C[6]^C[7]^C[8]^C[13]^C[18]^C[19]^C[24]^C[27]^C[28]^C[29]^C[30]^C[31] | // 18 terms |
| CTree[9] = | D[1]^D[2]^D[26]^C[0]^C[1]^C[5]^C[7]^C[8]^C[9]^C[14]^C[19]^C[20]^C[25]^C[28]^C[29]^C[30]^C[31] | // 18 terms |
| CTree[10] = | D[0]^D[3]^C[1]^C[5]^C[9]^C[10]^C[11]^C[12]^C[15]^C[22]^C[24]^C[25]^C[27]^C[28]^C[29]^C[31] | // 15 terms |
| CTree[11] = | D[2]^C[0]^C[5]^C[8]^C[10]^C[11]^C[12]^C[13]^C[16]^C[20]^C[21]^C[22]^C[23]^C[24]^C[27]^C[29] | // 16 terms |
| CTree[12] = | D[3]^C[0]^C[1]^C[2]^C[5]^C[6]^C[8]^C[9]^C[11]^C[13]^C[14]^C[17]^C[20]^C[23]^C[26]^C[27] | // 15 terms |
| CTree[13] = | D[2]^C[1]^C[2]^C[3]^C[6]^C[9]^C[10]^C[12]^C[14]^C[15]^C[18]^C[21]^C[24]^C[27]^C[28] | // 15 terms |
| CTree[14] = | D[2]^C[2]^C[3]^C[4]^C[7]^C[10]^C[11]^C[13]^C[15]^C[16]^C[19]^C[22]^C[25]^C[28]^C[29] | // 15 terms |
| CTree[15] = | D[2]^C[0]^C[3]^C[4]^C[5]^C[8]^C[11]^C[12]^C[14]^C[16]^C[17]^C[20]^C[23]^C[26]^C[29]^C[30] | // 16 terms |
| CTree[16] = | D[3]^C[0]^C[1]^C[4]^C[8]^C[9]^C[13]^C[15]^C[17]^C[18]^C[20]^C[22]^C[25]^C[26]^C[29]^C[30]^C[31] | // 17 terms |
| CTree[17] = | D[2]^C[1]^C[2]^C[5]^C[6]^C[9]^C[10]^C[14]^C[16]^C[18]^C[19]^C[21]^C[23]^C[26]^C[27]^C[31] | // 16 terms |
| CTree[18] = | D[1]^C[2]^C[3]^C[6]^C[7]^C[10]^C[11]^C[15]^C[17]^C[19]^C[20]^C[22]^C[24]^C[27]^C[28] | // 15 terms |
| CTree[19] = | D[0]^C[3]^C[4]^C[7]^C[11]^C[12]^C[16]^C[18]^C[20]^C[21]^C[23]^C[25]^C[28]^C[29]^C[30] | // 15 terms |
| CTree[20] = | C[0]^C[4]^C[5]^C[8]^C[12]^C[13]^C[17]^C[19]^C[21]^C[22]^C[24]^C[26]^C[29]^C[30] | // 14 terms |
| CTree[21] = | C[1]^C[5]^C[6]^C[9]^C[13]^C[14]^C[18]^C[20]^C[22]^C[23]^C[25]^C[27]^C[30]^C[31] | // 14 terms |
| CTree[22] = | C[5]^C[7]^C[8]^C[10]^C[12]^C[14]^C[15]^C[19]^C[20]^C[22]^C[23]^C[25]^C[27]^C[30]^C[31] | // 15 terms |
| CTree[23] = | C[2]^C[5]^C[9]^C[11]^C[12]^C[13]^C[15]^C[16]^C[22]^C[23]^C[25]^C[27]^C[30]^C[31] | // 14 terms |
| CTree[24] = | C[3]^C[6]^C[10]^C[12]^C[13]^C[14]^C[16]^C[17]^C[23]^C[24]^C[26]^C[28]^C[29] | // 13 terms |
| CTree[25] = | C[4]^C[7]^C[11]^C[13]^C[14]^C[15]^C[17]^C[18]^C[24]^C[25]^C[27]^C[29] | // 12 terms |
| CTree[26] = | D[9]^C[0]^C[2]^C[6]^C[14]^C[15]^C[16]^C[18]^C[19]^C[20]^C[21]^C[22]^C[24]^C[27] | // 14 terms |
| CTree[27] = | D[8]^C[0]^C[1]^C[3]^C[7]^C[15]^C[16]^C[17]^C[19]^C[20]^C[21]^C[22]^C[23]^C[25]^C[28] | // 15 terms |
| CTree[28] = | D[7]^C[1]^C[2]^C[4]^C[8]^C[16]^C[17]^C[18]^C[20]^C[21]^C[22]^C[23]^C[24]^C[26]^C[29] | // 15 terms |
| CTree[29] = | D[6]^C[2]^C[3]^C[5]^C[9]^C[17]^C[18]^C[19]^C[21]^C[22]^C[23]^C[24]^C[25]^C[27]^C[30] | // 15 terms |
| CTree[30] = | D[5]^C[3]^C[0]^C[3]^C[4]^C[6]^C[10]^C[18]^C[19]^C[20]^C[22]^C[23]^C[24]^C[25]^C[26]^C[28]^C[31] | // 16 terms |
| CTree[31] = | D[4]^C[1]^C[4]^C[5]^C[7]^C[11]^C[19]^C[20]^C[21]^C[23]^C[24]^C[25]^C[26]^C[27]^C[29] | // 15 terms |
| | | // 488 total |

FIG. 6

ERROR DETECTION IN A COMMUNICATIONS LINK

BACKGROUND

1. Field of the Invention

This application is related to integrated circuits and more particularly to data communications links between integrated circuits.

2. Description of the Related Art

In a typical communications system, error detection and correction techniques are used to maintain the integrity of data communicated across a channel that experiences noise. Due to high data rates of typical high-speed communications interfaces, error detection techniques may be implemented by dedicated circuitry. Hardware implementations of error detection techniques may be costly, e.g., occupy substantial portions of an integrated circuit die. Accordingly, improved techniques for implementing error detection circuitry on an integrated circuit are desired.

SUMMARY

An integrated circuit communications interface operable consistent with multiple data transmission protocols includes error detection circuitry that implements a cyclic redundancy check (i.e., CRC) function. The error detection circuitry generates a checksum based, at least in part, on a selected one of the multiple data transmission protocols. The error detection circuitry includes at least one circuit that generates a digital code according to an operation including terms common to the multiple data transmission protocols. That digital code is combined with a selected digital code to generate the CRC. The selected digital code is generated by an individual circuit corresponding to a respective one of the multiple data transmission protocols. The individual circuit generates the selected digital code according to an operation including at least terms exclusive to the respective one of the multiple data transmission protocols.

In at least one embodiment of the invention, an apparatus for detecting errors in data transmitted over a communications link having at least a first mode of operation and a second mode of operation includes a select circuit configured to select between a first digital code and a second digital code. The selection is based, at least in part, on a selected mode of operation. The first digital code is based, at least in part, on a first logical operation of at least a first plurality of data bits of a data stream corresponding to a plurality of communications paths. The first logical operation is consistent with the first mode of operation. The second digital code is based, at least in part, on a second logical operation of at least a second plurality of data bits of the data stream. The second logical operation is consistent with the second mode of operation. The apparatus includes a circuit configured to generate a next value of an error detection code, based, at least in part, on a third digital code and a selected one of the first and second digital codes. The third digital code is based, at least in part, on a third logical operation of at least a plurality of bits of a current value of the error detection code and the third logical operation is consistent with the first and second modes of operation.

In at least one embodiment of the invention, a method for detecting errors in data transmitted over a communications link having at least a first mode of operation and a second mode of operation includes generating a next value of an error detection code, based, at least in part, on a selected one of a first digital code and a second digital code and based, at least in part, on a third digital code. The first digital code is based, at least in part, on a first logical operation of at least a first plurality of data bits of a data stream corresponding to a plurality of communications paths. The first logical operation is consistent with the first mode of operation. The second digital code is based, at least in part, on a second logical operation of at least a second plurality of data bits of the data stream. The second logical operation is consistent with the second mode of operation. The third digital code is based, at least in part, on a third logical operation of at least a plurality of bits of a current value of the error detection code and consistent with the first and second modes of operation.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
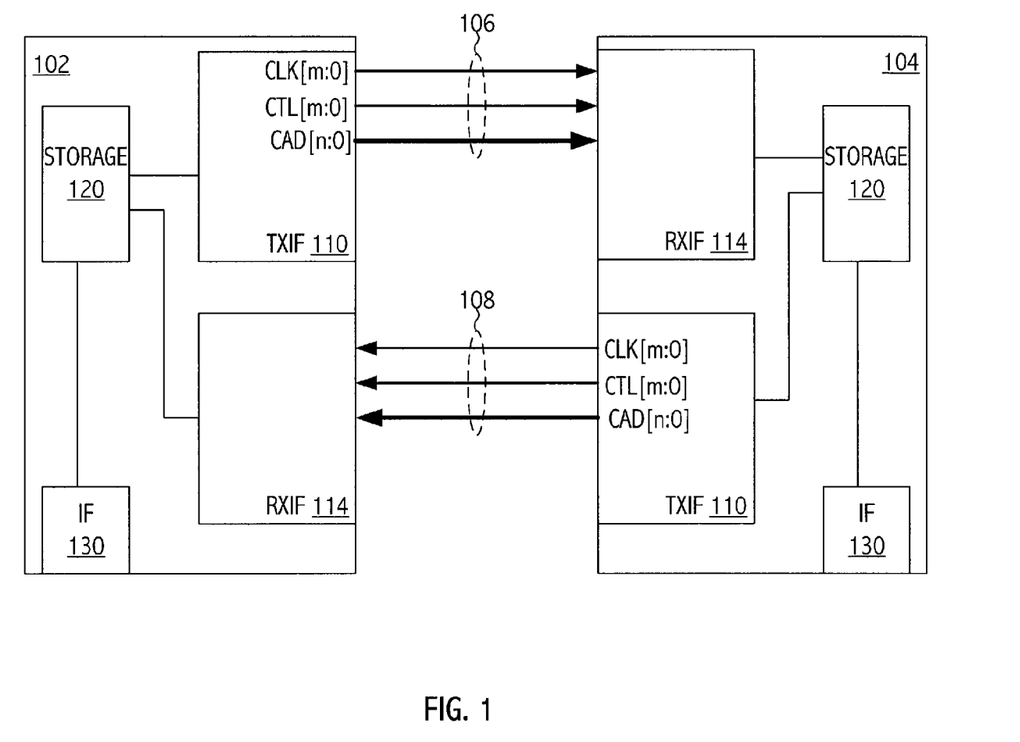
FIG. 1 illustrates a block diagram of two integrated circuit devices coupled by a communications link consistent with one or more embodiments of the present invention.

Referring to FIG. 1, integrated circuit 102 communicates with integrated circuit 104 by an exemplary communications link including transmit interfaces 110, receive interfaces 114, and communications paths 106 and 108, which include respective, individual communications paths for clock signals (e.g., CLK[m:0]), control signals (e.g., CTL[m:0]), and data signals (e.g., n-bits of commands, addresses, or data, i.e., CAD[n:0]). Those individual communications paths may be single-ended or differential communications paths. In at least one embodiment of the communications link, a bit-time is half of a clock period in duration, i.e., two data bits (e.g., two CAD[n:0] bits or two CTL[m:0] bits) are transmitted on a corresponding communications path per clock cycle (e.g., a period of a respective one of CLK[m:0]). However, the teachings herein may be adapted for bit-times having one clock period in duration (i.e., one data bit is transmitted on a corresponding communications path per clock cycle) or for other suitable bit-time durations. Communications paths 106 and 108 are unidirectional, i.e., communications paths 106 provide paths from integrated circuit 102 to integrated circuit 104 and communications paths 108 provide paths to integrated circuit 102 from integrated circuit 104. Integrated circuit 102 includes a sideband control mechanism (e.g., interface 130) that provides access to control and/or status registers internal to integrated circuit 102 (e.g., locations in storage circuit 120). Interface 130 may be a Joint Test Action Group (i.e., JTAG) interface, System Management Bus (i.e., SMBus) interface, or other suitable interface. In at least one embodiment, interface 130 communicates test, characterization, and/or diagnostic information between the corresponding integrated circuit and an external processing device (not shown).

Figure 2:
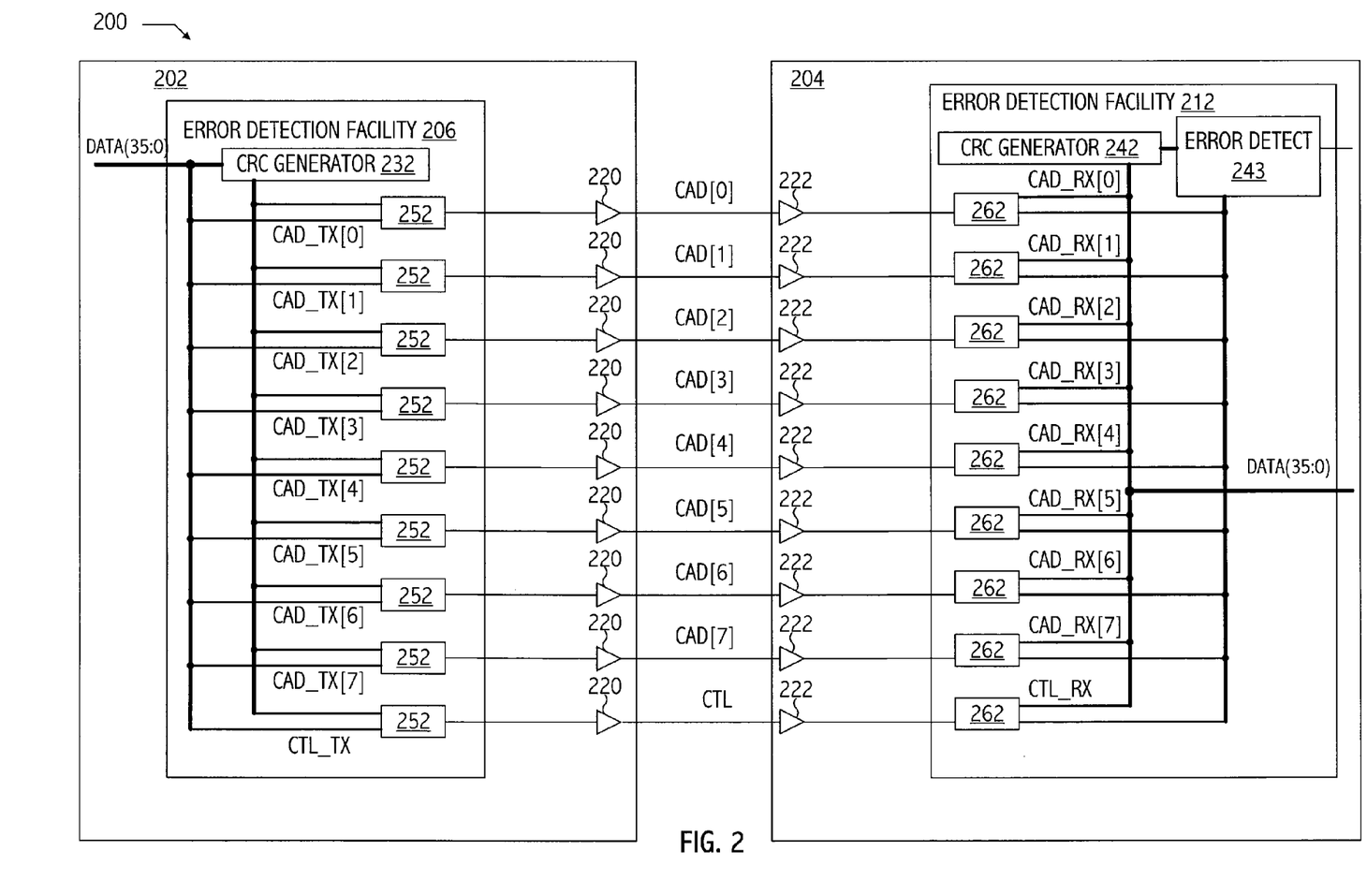
FIG. 2 illustrates a block diagram of portions of an exemplary communications link including error detection circuitry consistent with one or more embodiments of the present invention.

Referring to FIG. 2, an exemplary transmit interface (e.g., transmit interface 202) may perform exemplary transmit operations (e.g., transmitter circuits 220 may perform scrambling operations, signal encoding, signal level shifting, or other appropriate signal processing operations). The transmitted signals are received by an exemplary receive interface (e.g., receive interface 204), which performs exemplary receive operations (e.g., receive circuits 222 may perform signal equalization, signal level shifting, signal decoding, signal descrambling or other appropriate signal processing functions).

Communications link 200 implements a typical error detection technique that transmits a number of bits that is greater than the number of bits in the original data. Transmit interface 202 sends the original data bits, followed by redundancy (i.e., check) bits, which are used to detect errors. In at least one embodiment of communications link 200, transmit interface 202 implements a cyclic redundancy check. A cyclic redundancy check treats a block of data as the coefficients to a polynomial. A binary division without a bit-carry (e.g., by using an exclusive-or instead of subtraction) of the data polynomial by a fixed, predetermined polynomial generates a remainder that is used as the redundancy bits (i.e., a "CRC checksum" or "CRC"). The receiver can regenerate the CRC from the received data bits and compare the regenerated CRC to a received CRC to determine whether or not an error has occurred. An error is detected when a mismatch occurs between the received CRC and the regenerated CRC.

A block of data used for a CRC checksum operation may vary according to the communications protocol. In at least one embodiment, communications link 200 is compliant with multiple protocols. For example, a protocol referred to herein as a "periodic protocol" requires computing a CRC periodically over a predetermined number of bit-times (e.g., 512 bit-times). The CRC may be initialized to all ones and may be bit-wise inverted prior to transmission. The CRC is inserted into a data stream for transmission over the link after the end of a fixed data window (e.g., 64 bit-times after the end of a 512 bit-time window). The data used to compute the CRC for the periodic protocol may be based on a link width. For example, a link may be 2, 4, 8, 16, or 32 bits wide, i.e., the link may include 2, 4, 8, 16, or 32 paths for communicating command, address, or data information. A separate CRC may be computed independently for individual groups of a predetermined number of paths (e.g., each 8-bit lane) of the link. Another communications protocol requires initializing the CRC (e.g., to all ones) for every packet, appending the CRC to every packet, and is referred to herein as a "packet-based protocol." The data used to compute the CRC in the packet-based protocol may be independent of the link width. The packet-based protocol may be included for a hardware-based retry mode that allows recovery from soft errors at the link level.

Exemplary transmit interface 202 includes exemplary error detection facility circuit 206 that receives multiple (e.g., four) bit-times of data in parallel (e.g., DATA[35:0]) for transmission over a nine-bit link (i.e., 8-bit lane CAD[7:0] and corresponding control path CTL). A checksum generator circuit (e.g., CRC generator 232) generates an output CRC checksum based on the data for transmission over the link. CRC generator 232 operates on multiple bit-times (e.g., DATA[35:0] which includes four bit-times of data for transmission over 8-bit lane CAD[7:0] and corresponding control path CTL) in parallel. Note that in other embodiments, error detection facility 206 receives other suitable numbers of bit-times of data for processing in parallel.

CRC generator circuit 232 includes logic circuitry to implement CRC operations consistent with a plurality of modes of operation. For example, referring to FIG. 3, CRC generation circuit 300 may be configured to generate a CRC consistent with a periodic protocol or consistent with a packet-based protocol. Exemplary CRC generator circuit 300 receives the four bit-times of data for transmission over nine communications paths and computes a CRC checksum value for the four bit-times in parallel, e.g., CRC[31:0], which is stored in storage element 316. The operation used to generate the CRC consistent with the periodic protocol shares some logic terms with the operation used to generate the CRC consistent with the packet-based protocol, e.g., as a result of the two protocols implementing the same CRC polynomial. The operation including those common terms is performed by common logic circuit 308.

Figure 3:
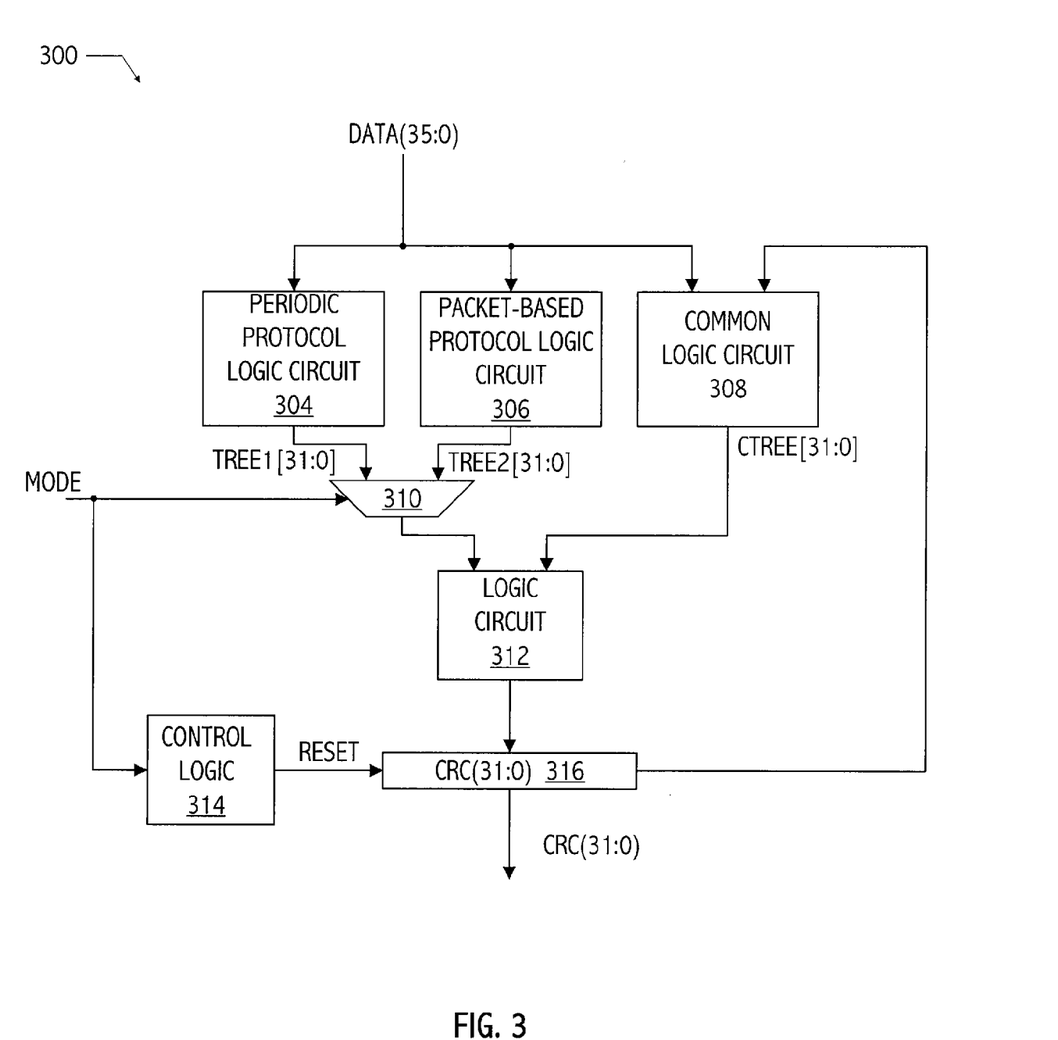
FIG. 3 illustrates a block diagram of an exemplary error detection circuit consistent with one or more embodiments of the present invention.

However, generation of the CRC consistent with the periodic protocol requires some operations exclusive to the periodic protocol. Those operations are performed by periodic protocol logic circuit 304. Packet-based protocol logic circuit 306 performs at least operations exclusive to the packet-based protocol. In at least one embodiment of CRC generation circuit 300, to provide logical separation between the data and the CRC, which is transmitted immediately after the data, packet-based protocol logic circuit 306 effectively introduces a plurality of dummy bits (e.g., 32 dummy bits) into the data stream. The logical separation reduces susceptibility of an error burst affecting both data and the CRC checksum. Exemplary operations performed by periodic protocol logic circuit 304, packet-based protocol logic circuit 306, and common logic circuit 308 include bitwise shifts of the operands and bitwise exclusive-ors of the operands.

Select circuit 310 provides as an output, a selected one of the outputs of the periodic protocol logic circuit 304 and the packet-based protocol logic circuit 306 according to a select signal indicating a selected mode of operation indicative of a particular communication link protocol. Logic circuit 312 combines the output of select circuit 310 with the output of common logic circuit 308 to generate the next value of the CRC. Control logic 314 generates a reset signal that resets CRC accumulation storage element 316 (e.g., sets individual bits of storage element to all ones or all zeros) consistent with the selected protocol. For example, storage element 316 is reset to all ones every packet when the packet-based protocol mode is selected. CRC accumulation storage element 316 is reset to all ones periodically, e.g., every 512 bit-times, when the periodic protocol mode is selected.

The output of logic circuit 312, which is stored in CRC accumulation storage element 316, is consistent with a CRC checksum based on the following polynomial function:

$$x^{32}+x^{26}+x^{23}+x^{22}+x^{16}+x^{12}+x^{11}+x^{10}+x^{8}+x^{7}+x^{5}+x^{4}+x^{2}+x+1.$$

In periodic mode, an exemplary CRC operation may be performed on the contents of CRC accumulation storage element 316 across a single bit-time (nine bits) of data, consistent with the following pseudocode:

```
static uint poly = 0x04C11DB7; /*polynomial*/
unit compute_CRC (uint data, unint CRC)
{
    int j;
    for (j = 0; j < 9; ++j){
    /* do nine times for nine communications paths */
        uint tmp = CRC >> 31 /* store highest bit */
        CRC = (CRC << 1) | ((data >> j) & 1);
        /* shift message in */
        CRC = (tmp) ? CRC ^ poly : CRC;
        /* subtract poly if greater */
    };
    return CRC;
};
```

To improve circuit performance (e.g., reduce latency), a circuit implementation may unroll the loop and include logic to perform the operations on multiple bit-times of data (e.g., four bit-times or other suitable number of bit-times).

In an exemplary packet-based protocol, the CRC operation is independent of the link width. In various embodiments of the invention, bits from individual bit-times of individual double words of a packet may be combined for processing, consistent with the following pseudocode (where the subscripts enumerate corresponding bit-times):

```
case (size) {
2: data = {CTL₁₂, CAD₁₅[1:0], CAD₁₄[1:0], CAD₁₃[1:0], CAD₁₂[1:0],
        CTL₈, CAD₁₁[1:0], CAD₁₀[1:0], CAD₉[1:0] , CAD₈[1:0],
        CTL₄, CAD₇[1:0], CAD₆[1:0], CAD₅[1:0] , CAD₄[1:0],
        CTL₀, CAD₃[1:0], CAD₂[1:0], CAD₁[1:0] , CAD₀[1:0]}
4: data = {CTL₆, CAD₇[3:0], CAD₆[3:0], CTL₄, CAD₅[3:0], CAD₄[3:0],
        CTL₂, CAD₃[3:0], CAD₂[3:0], CTL₀, CAD₁[3:0], CAD₀[3:0], }
8: data = {CTL₃, CAD₃[7:0], CTL₂, CAD₂[7:0],
        CTL₁, CAD₁[7:0], CTL₀, CAD₀[7:0]}
16: data = {CTL₁[1], CAD₁[15:8], CTL₁[0], CAD₁[7:0],
        CTL₀[1], CAD₀[15:8], CTL₀[0], CAD₀[7:0]}
32: data = {CTL[3], CAD[31:24], CTL[2], CAD[23:16],
        CTL[1], CAD[15:8], CTL[0], CAD[7:0]}.
```

In the exemplary packet-based mode, the CRC operation is modified to limit burst errors from affecting both data and the CRC. In at least one embodiment of a CRC computation, a predetermined number of pad bits (e.g., 32 bits) are appended to the data, thus requiring at least one additional pass through the CRC operation loop above. Rather than performing extra passes through the CRC loop for each pad bit (e.g., 32 extra passes), the CRC operation may be modified to effectuate the data padding by any suitable technique. For example, rearranging the CRC operation to introduce the data at the most-significant end of the CRC register operates as if the data had been zero-padded by the number of bits of the CRC register. An exemplary resulting CRC operation is consistent with the following pseudocode:

```
static uint poly = 0x04C11DB7; /*polynomial*/
unit compute_CRC (uint data, unint CRC)
{
    int j;
    for (j = 0; j < 36; ++j){
    /* do 36 times for four bit-times over nine communications paths */
    /* XOR highest bit with message */
        uint tmp = ((CRC >> 31 & 1 )^((data >> j) & 1);
        CRC = (tmp) ? (CRC << 1) ^ poly : (crc << 1);
        /* subtract poly if greater */
    };
    return CRC;
};
```

As a result of rearranging the CRC operation to effectuate zero-padding of the data in the same number of loop iterations as a CRC operation without the zero-padding, a circuit corresponding to the CRC operation effectuating zero-padding of the data includes additional logical terms that are not present in a circuit implementing the CRC operation without zero-padding of the data.

Figure 4:
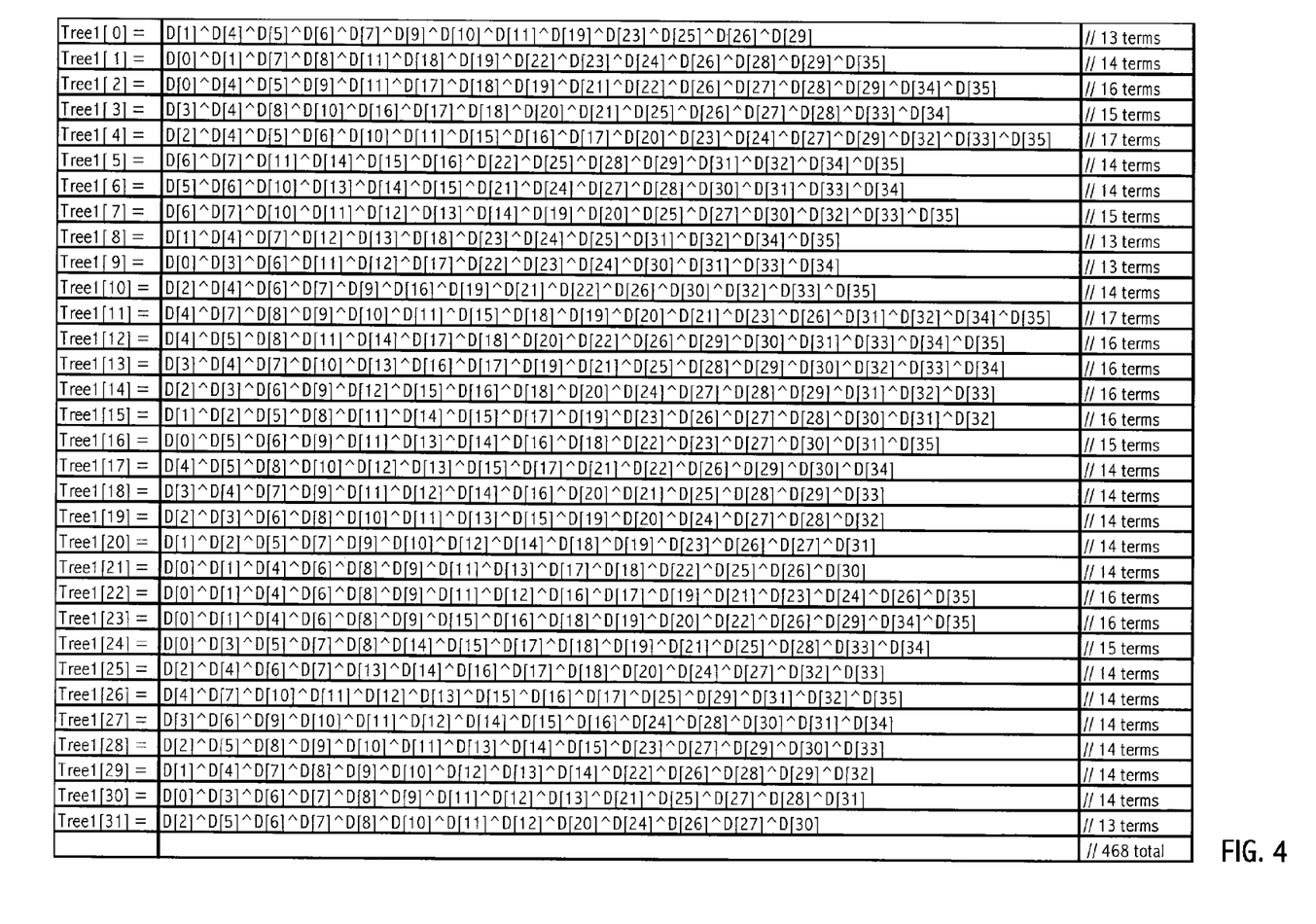
FIG. 4 illustrates a table of an exemplary implementation of a portion of a cyclic redundancy check operation consistent with a first mode of operation and consistent with one or more embodiments of the present invention.
Figure 5:
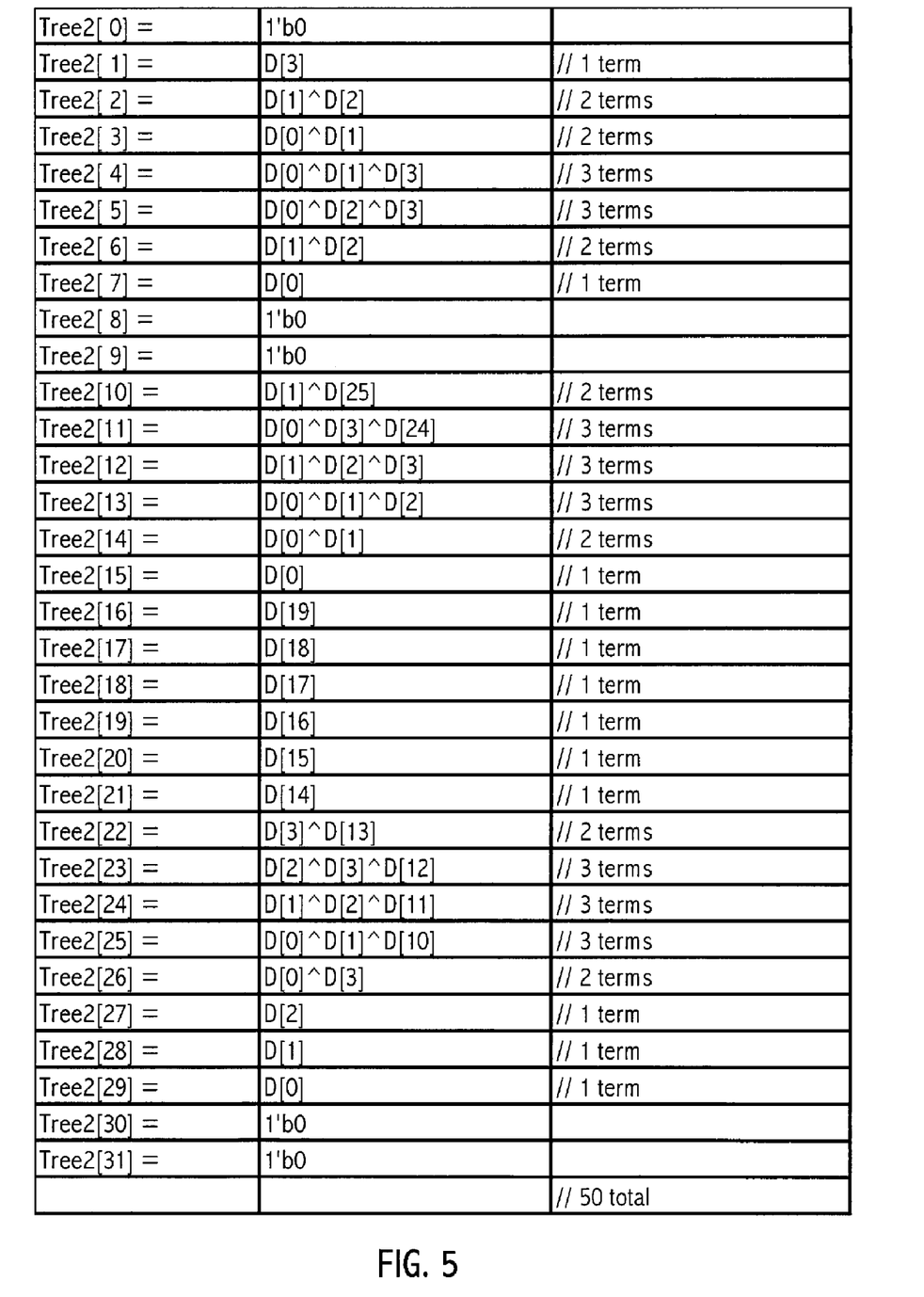
FIG. 5 illustrates a table of an exemplary implementation of a portion of a cyclic redundancy check operation consistent with a second mode of operation and consistent with one or more embodiments of the present invention.
Figure 6:
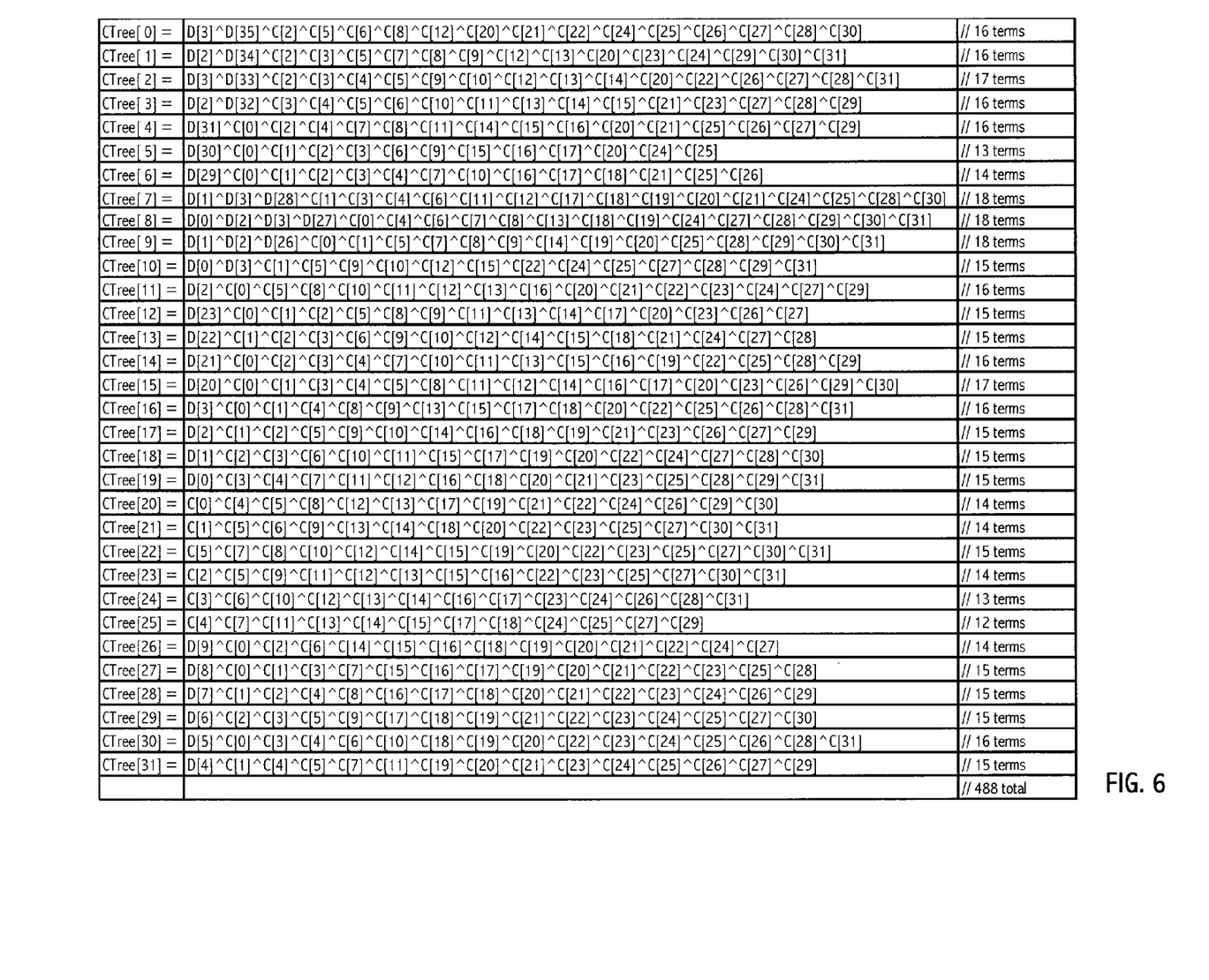
FIG. 6 illustrates a table of an exemplary implementation of a portion of a cyclic redundancy check operation consistent with both the first and second modes of operation and consistent with one or more embodiments of the present invention.

Referring to FIGS. 3-6, exemplary logical operations implemented by periodic protocol logic circuit 304, packet-based protocol logic circuit 306, and common logic circuit 308 include the bit-wise exclusive-or operations of FIG. 4, FIG. 5, and FIG. 6, respectively. The output of common logic circuit 308 (i.e., CTree[31:0] of FIG. 6) is the result of a logical operation on CRC[31:0] (i.e., C[31:0] in FIGS. 4-6) and individual bits of DATA[35:0] (i.e., D[35:0] in FIGS. 4-6) that includes only terms common to both the periodic protocol and the packet-based protocol. The output of periodic protocol logic circuit 304 (i.e., Tree1[31:0] of FIG. 4) is the result of a logical operation on individual bits of DATA [35:0] including at least terms exclusive to the periodic protocol. Periodic protocol logic circuit 304 may implement a logical operation that includes terms common to the packet-based protocol, but are not included in the operation implemented by common logic circuit 308 to reduce delay through common logic circuit 308. For example, common logic circuit 308 may be implemented using 2-input XOR gates or 3-input XOR gates forming a tree of XOR gates having a number of levels (e.g., a number of levels may equal $\log_2$ (number of terms in an operation)). By including one or more terms in a tree of XOR gates in periodic protocol logic circuit 304 and packet-based protocol logic circuit 306 instead of in common logic circuit 308, a number of levels of gates in common logic circuit 308 may be reduced, thereby reducing the latency of CRC generation circuit 300. Note that allocation of terms to operations associated with periodic protocol logic circuit 304, packet-based protocol logic circuit 306, and common logic circuit 308 may be automated.

The output of packet-based protocol logic circuit 306 (i.e., Tree2[31:0] of FIG. 5) is the result of a logical operation on individual bits of DATA [35:0] including at least terms exclusive to the packet-based protocol. Packet-based protocol logic circuit 306 may implement a logical operation that includes terms common to the periodic protocol, but are not included in the operation implemented by common logic circuit 308 to reduce delay through common logic circuit 308. Note that the particular terms designated in Tree1, Tree2, and CTree are exemplary only and other allocations of terms to periodic protocol logic circuit 304, packet-based protocol logic circuit 306, and common logic circuit 308, for the same or other checksum computations are consistent with the invention described herein.

Referring back to FIG. 2, control circuits 252 may queue individual bits of DATA[35:0] and issue appropriate bit-times of data or selectively issue the output CRC checksum to transmitter circuits 220 for transmission over corresponding transmission paths (e.g., corresponding ones of CAD[7:0] and CTL). Receiver circuits 222 of receive interface 204 receive the signals from communications paths CAD[0:7] and CTL. Receiver circuits 222 may perform signal equalization, signal level shifting, noise reduction, or other appropriate signal processing functions on signals received from respective ones of the communications paths. The received signals are then received by circuits 262, which may queue a number of bit-times of the data or CRC checksum for further processing. Circuits 262 also extract a received CRC checksum from the received signals and supply the received CRC to error detection circuit 243. Circuits 262 supply the data stream to CRC generator 242. CRC generator 242 operates substantially the same as CRC generator 232 to regenerate the CRC from the received data and supplies the regenerated CRC to error detection circuit 243. Error detection circuit 243 compares the regenerated CRC to the received CRC. If the regenerated CRC and the received CRC do not match, an error is detected and any suitable error correction technique is effectuated.

The description of the invention set forth herein is illustrative, and is not intended to limit the scope of the invention as set forth in the following claims. For example, while the invention has been described in an embodiment in which a particular CRC polynomial is applied to four bit-times of data in parallel for communications over a communications link having eight CAD communications path and one CTL communications path, one of skill in the art will appreciate that the teachings herein can be utilized for communications links having other widths and applying other CRC polynomials to other numbers of bit-times of data in parallel. In addition, techniques described herein may be applied to other protocols and error detection schemes other than a CRC (e.g., repetition schemes, parity schemes, polarity schemes, and Hamming-based distance checks). Variations and modifications of the embodiments disclosed herein may be made based on the description set forth herein, without departing from the scope and spirit of the invention as set forth in the following claims.

What is claimed is:

1. An apparatus for detecting errors in data transmitted over a communications link having at least a first mode of operation and a second mode of operation comprising:
   a select circuit configured to select, and provide as a selected code, one of a first digital code and a second digital code, the selection being based, at least in part, on a selected mode of operation, the first digital code being based, at least in part, on a first logical operation of at least a first plurality of data bits of a data stream corresponding to a plurality of communications paths, the first logical operation being consistent with the first mode of operation, the second digital code being based, at least in part, on a second logical operation of at least a second plurality of data bits of the data stream, the second logical operation being consistent with the second mode of operation; and
   a circuit configured to generate a next value of an error detection code, based, at least in part, on a third digital code and the selected code,
   wherein the third digital code is based, at least in part, on a third logical operation of at least a plurality of bits of a current value of the error detection code and the third logical operation is consistent with the first and second modes of operation.

2. The apparatus, as recited in claim 1, further comprising:
   a first circuit configured to generate the first digital code based, at least in part, on the first logical operation of the at least first plurality of data bits of the data stream corresponding to the plurality of communications paths; and
   a second circuit configured to generate the second digital code based, at least in part, on the second logical operation of the at least second plurality of data bits of the data stream; and
   a third circuit configured to generate the third digital code based, at least in part, on the third digital code being based, at least in part, on the third logical operation of at least the plurality of bits of the current value of the error detection code.

3. The apparatus, as recited in claim 1, further comprising:
   a control circuit configured to reset the current value of the error detection code periodically after a predetermined number of bit-times in response to the first mode being selected and configured to reset the current value of the error detection code on a per-packet basis in response to the second mode being selected.

4. The apparatus, as recited in claim 1, further comprising:
   a control circuit configured to insert an error detection code into the data stream after a first predetermined number of bit-times from an end of the data bits used to generate the error detection code, the insertion being based, at least in part, on the next value of the error detection code and the insertion being in response to selection of the first mode and the control circuit being configured to append the error detection code to a packet including the data bits used to generate the error detection code in response to selection of the second mode.

5. The apparatus, as recited in claim 1, wherein the second logical operation includes at least one term for effectuating padding of the data stream by a predetermined number of bits, thereby reducing effects of burst-type errors affecting a packet of data and the error detection code.

6. The apparatus, as recited in claim 1, wherein the first, second, and third digital codes have the same number of bits and the digital code is generated by a bitwise operation of the third digital code and the selected code.

7. The apparatus, as recited in claim 1, wherein the first and second pluralities of data bits include data bits corresponding to respective ones of a plurality of bit-times.

8. The apparatus, as recited in claim 1, wherein the next digital code is a cyclic redundancy check (CRC) code related to the data code by a polynomial function.

9. The apparatus, as recited in claim 8, wherein the polynomial function is $x^{32}+x^{26}+x^{23}+x^{22}+x^{16}+x^{12}+x^{11}+x^{10}+x^{8}+x^{7}+x^{5}+x^{4}+x^{2}+x+1$.

10. The apparatus, as recited in claim 1, wherein the first logical operation includes at least one term exclusive to the first logical operation and the second logical operation includes at least one term exclusive to the second logical operation.

11. A method for detecting errors in data transmitted over a communications link having at least a first mode of operation and a second mode of operation comprising:
   generating a next value of an error detection code by a communications interface coupled to the communications link, based, at least in part, on one of a first digital code and a second digital code and based, at least in part, on a third digital code,
   wherein the first digital code is based, at least in part, on a first logical operation of at least a first plurality of data bits of a data stream corresponding to a plurality of communications paths, the first logical operation being consistent with the first mode of operation,
   wherein the second digital code is based, at least in part, on a second logical operation of at least a second plurality of data bits of the data stream, the second logical operation being consistent with the second mode of operation,
   wherein the third digital code is based, at least in part, on a third logical operation of at least a plurality of bits of a current value of the error detection code and consistent with the first and second modes of operation.

12. The method, as recited in claim 11, further comprising:
generating the first digital code based, at least in part, on the first logical operation of at least a first plurality of data bits of a data stream corresponding to a plurality of communications paths, the first logical operation being consistent with a first mode of operation;
generating the second digital code based, at least in part, on the second logical operation of at least a second plurality of data bits of the data stream, the second logical operation being consistent with a second mode of operation; and
generating the third digital code based, at least in part, on the third logical operation of the at least a plurality of bits of the current value of the error detection code and consistent with the first and second modes of operation.

13. The method, as recited in claim 11, further comprising:
resetting the current value of the error detection code periodically after a predetermined number of bit-times in response to the first mode being selected and configured to reset the current value of the error detection code on a per-packet basis in response to the second mode being selected.

14. The method, as recited in claim 11, further comprising:
inserting an error detection code based, at least in part, on the next value of the error detection code into the data stream after a first predetermined number of bit-times from an end of the data bits used to generate the error detection code, the insertion being in response to selection of the first mode; and
appending the next value of the error detection code to a packet including the data bits used to generate the next value of the error detection code in response to selection of the second mode.

15. The method, as recited in claim 11, further comprising:
selecting one of the first and second digital codes based, at least in part, on a selected mode of operation.

16. The method, as recited in claim 11, wherein the second logical operation includes at least one term for effectuating padding of the data stream by a predetermined number of bits, thereby reducing effects of burst-type errors affecting a packet of data and the error detection code.

17. The method, as recited in claim 11, wherein the first, second, and third digital codes have the same number of bits and the digital code is generated by a bitwise operation of one of the first and second digital codes with the third digital code.

18. The method, as recited in claim 11, wherein the first and second pluralities of data bits include data bits corresponding to respective ones of a plurality of bit-times.

19. The method, as recited in claim 11, wherein the next digital code is a cyclic redundancy check (CRC) code related to the data code by a polynomial function.

20. The method, as recited in claim 19, wherein the polynomial function is $x^{32}+x^{26}+x^{23}+x^{22}+x^{16}+x^{12}+x^{11}+x^{10}+x^{8}+x^{7}+x^{5}+x^{4}+x^{2}+x+1$.

21. The method, as recited in claim 11, wherein the first logical operation includes at least one term exclusive to the first logical operation and the second logical operation includes at least one term exclusive to the second logical operation.

22. An apparatus comprising:
means for selecting, and providing as a selected code, one of a first digital code and a second digital code, the first digital code being based, at least in part, on a first logical operation of at least a first plurality of data bits of a data stream corresponding to a plurality of communications paths, the first logical operation being consistent with a first mode of operation, the second digital code based, at least in part, on a second logical operation of at least a second plurality of data bits of the data stream, the second logical operation being consistent with a second mode of operation; and
means for generating a next value of an error detection code, based, at least in part, on a third digital code and the selected code, the third digital code being based, at least in part, on third logical operation of at least a plurality of bits of a current value of the error detection code and consistent with the first and second modes of operation.

23. The apparatus, as recited in claim 22, further comprising:
means for resetting the current value of the error detection code periodically after a predetermined number of bit-times in response to the first mode being selected and configured to reset the current value of the error detection code on a per-packet basis in response to the second mode being selected.

24. The method, as recited in claim 11, wherein the communications interface is a transmit interface and the method further comprises:
transmitting the data stream over the communications link; and
transmitting the next value of the error detection code over the communications link.

25. The method, as recited in claim 11, wherein the communications interface is a receive interface and the method further comprises:
receiving the data stream over the communications link; and
detecting errors in data received over the communications link based on the next value of the error detection code.

26. The method, as recited in claim 25, further comprising:
extracting a received error detection code from the data stream; and
comparing the received error detection code to the next value of the error detection code.

* * * * *